(12) United States Patent
Takeuchi et al.

(10) Patent No.: US 7,025,444 B2
(45) Date of Patent: Apr. 11, 2006

(54) MULTISLIT TYPE ACTUATOR, INKJET HEAD AND METHOD FOR MANUFACTURING MULTISLIT TYPE ACTUATOR

(75) Inventors: Yukihisa Takeuchi, Nishikamo-gun (JP); Hiroyuki Tsuji, Nagoya (JP); Kazumasa Kitamura, Ichinomiya (JP); Nobuo Takahashi, Owariasahi (JP)

(73) Assignee: NGK Insulators, Ltd., Nagoya (JP)

( * ) Notice: Subject to any disclaimer, the term of this patent is extended or adjusted under 35 U.S.C. 154(b) by 49 days.

(21) Appl. No.: 10/679,188

(22) Filed: Oct. 3, 2003

(65) Prior Publication Data

US 2004/0119791 A1  Jun. 24, 2004

Related U.S. Application Data

(63) Continuation of application No. PCT/JP02/03422, filed on Apr. 5, 2002.

(30) Foreign Application Priority Data

Apr. 6, 2001  (JP) .............................. 2001-108986

(51) Int. Cl.
*B41J 2/045* (2006.01)
(52) U.S. Cl. .......................................... 347/69; 347/68

(58) Field of Classification Search ............ 347/68–72, 347/20, 56, 61, 63, 65, 67
See application file for complete search history.

(56) References Cited

U.S. PATENT DOCUMENTS

| 4,879,568 A | 11/1989 | Bartky et al. .................. 347/69 |
| 5,072,240 A * | 12/1991 | Miyazawa et al. ............ 347/40 |
| 6,502,302 B1 | 1/2003 | Takeuchi et al. .............. 29/830 |
| 2002/0020057 A1 | 2/2002 | Takeuchi et al. .............. 29/830 |

FOREIGN PATENT DOCUMENTS

| EP | 0 600 748 B1 | 9/1998 |
| JP | 63-81003 A | 4/1988 |
| JP | 07-081055 A1 | 3/1995 |
| JP | 9-207332 A | 8/1997 |
| JP | 11-254678 A | 9/1999 |
| JP | 2000-168083 A | 6/2000 |
| JP | 2001-63048 A | 3/2001 |

\* cited by examiner

*Primary Examiner*—Juanita D. Stephens
(74) *Attorney, Agent, or Firm*—Burr & Brown

(57) ABSTRACT

A multislit type actuator including a plurality of piezoelectric actuators aligned and allocated like teeth of a comb formed on a substrate, wherein a condition of crystal grains in side surfaces of the piezoelectric actuators forming wall surfaces of a slit between the comb teeth is that the crystal grains under transgranular fracture are 1% or below.

19 Claims, 10 Drawing Sheets

PUNCHED AND LAMINATED SIMULTANEOUSLY

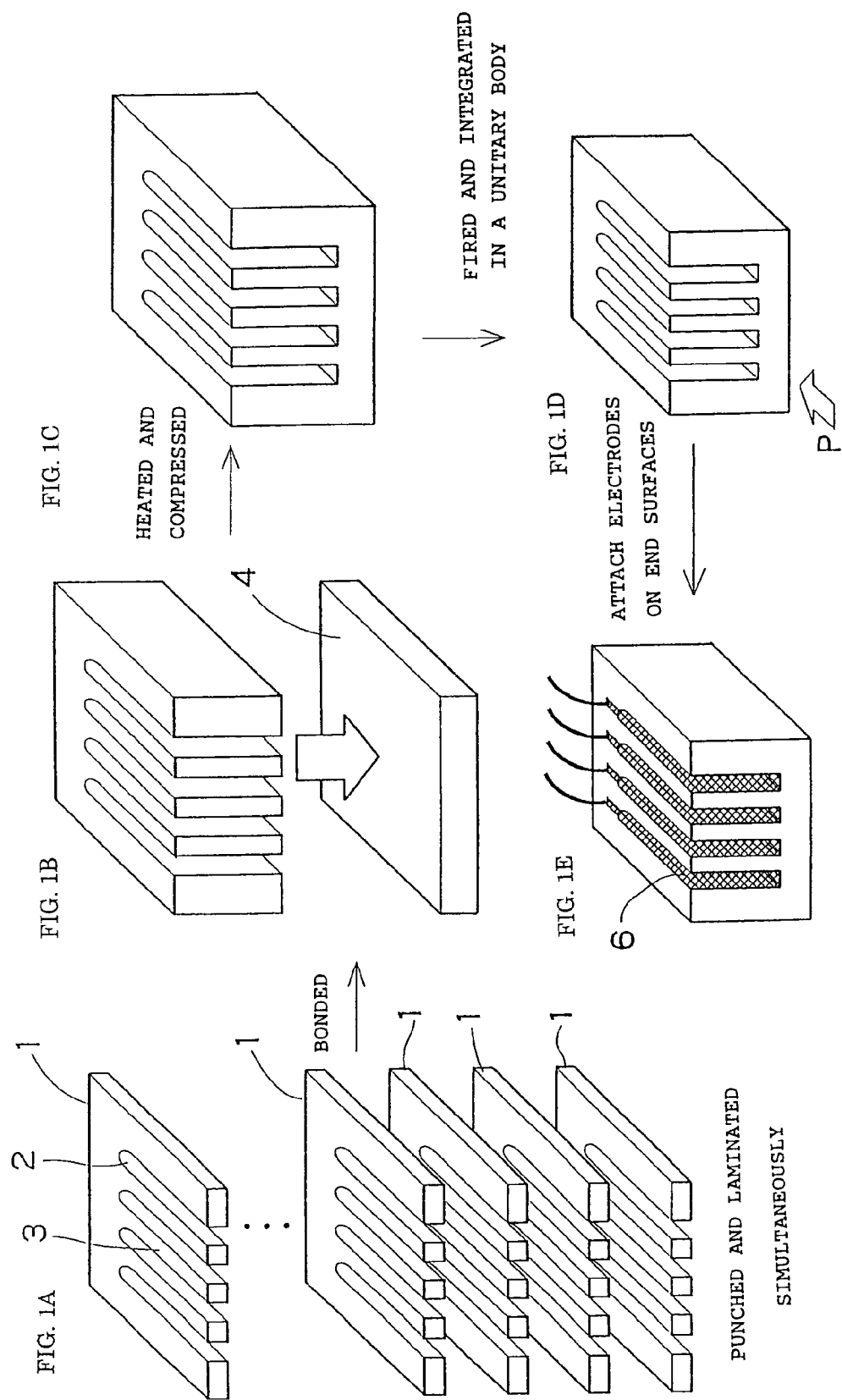

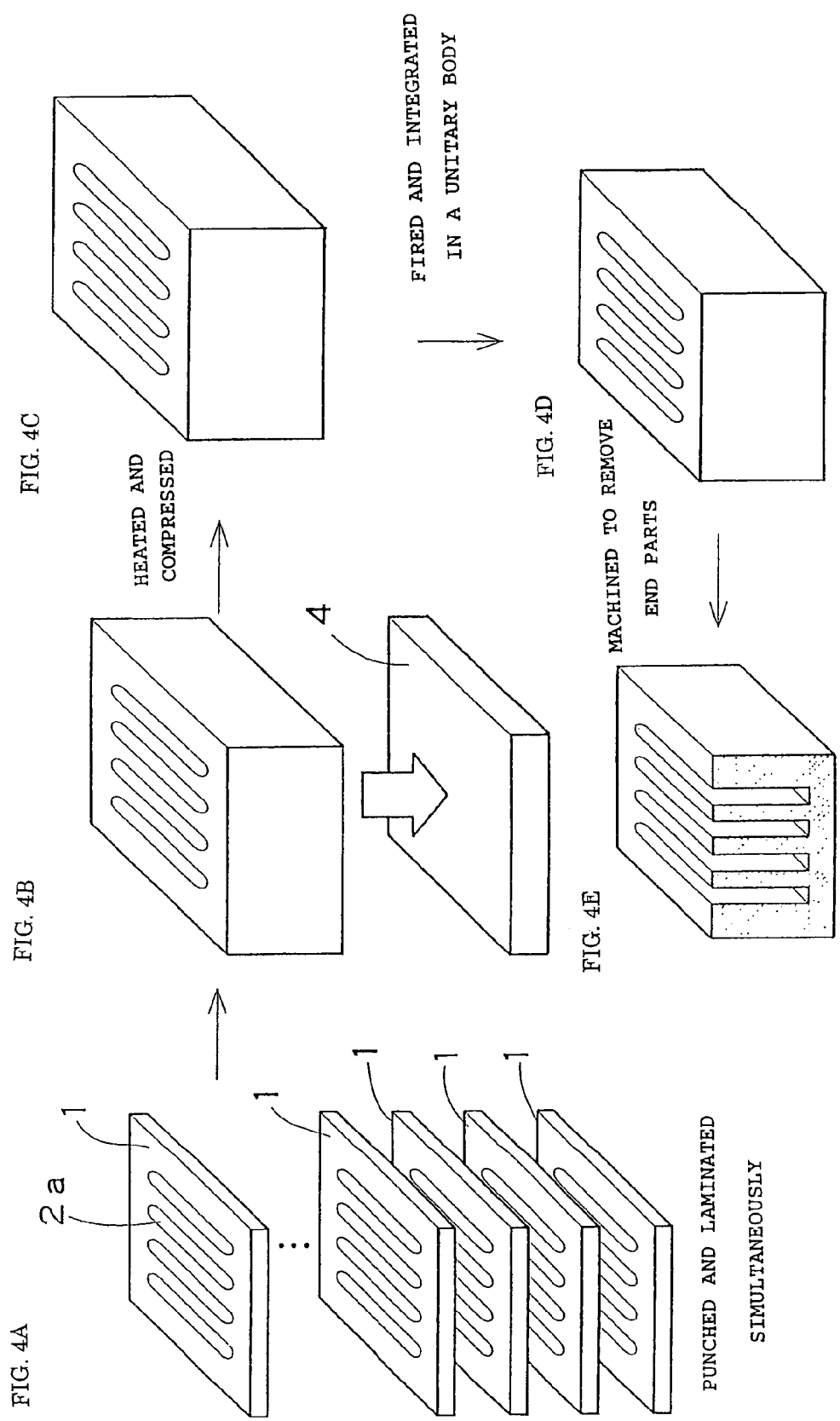

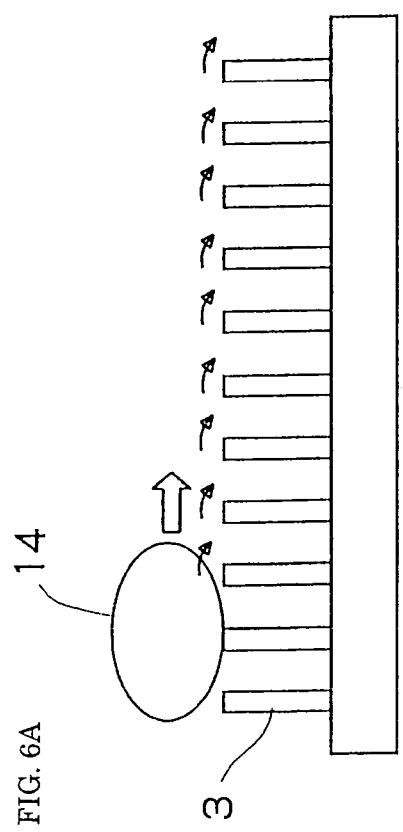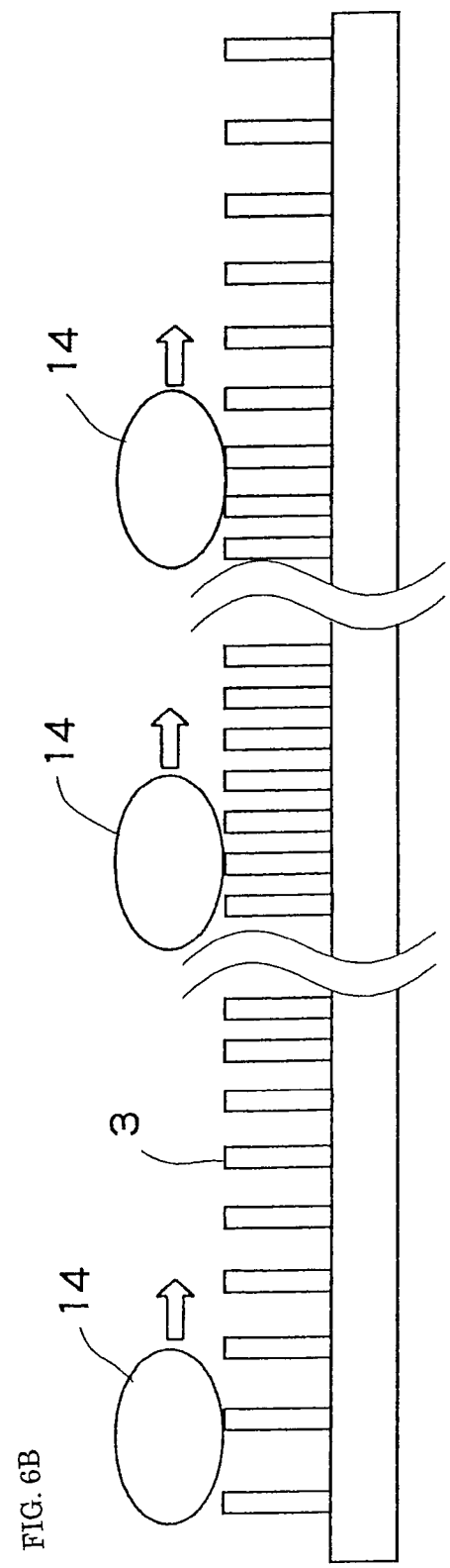

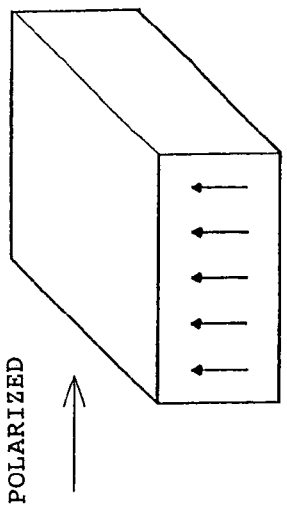
FIG. 7A
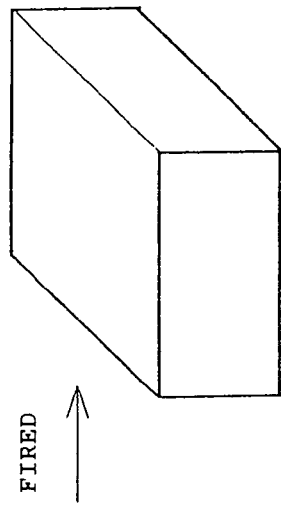
FIG. 7B
FIG. 7C
FIG. 7D
FIG. 7E
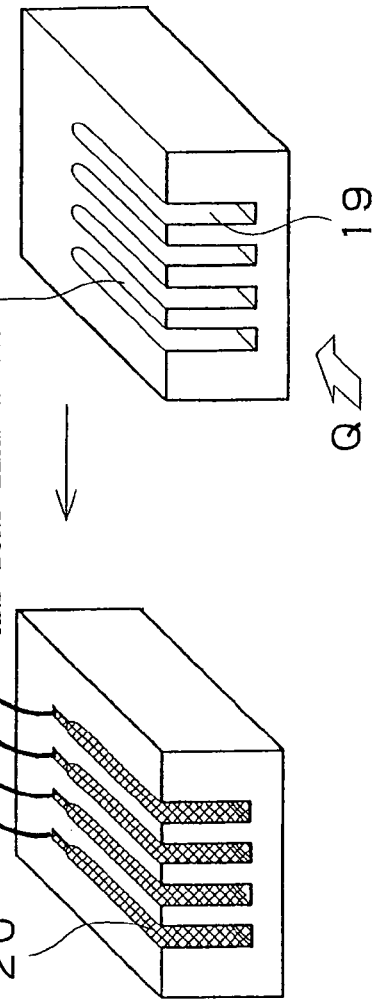
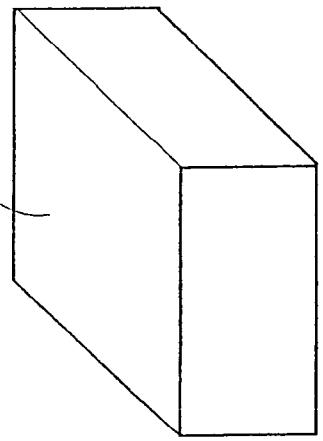

COMB TOOTH | SLIT

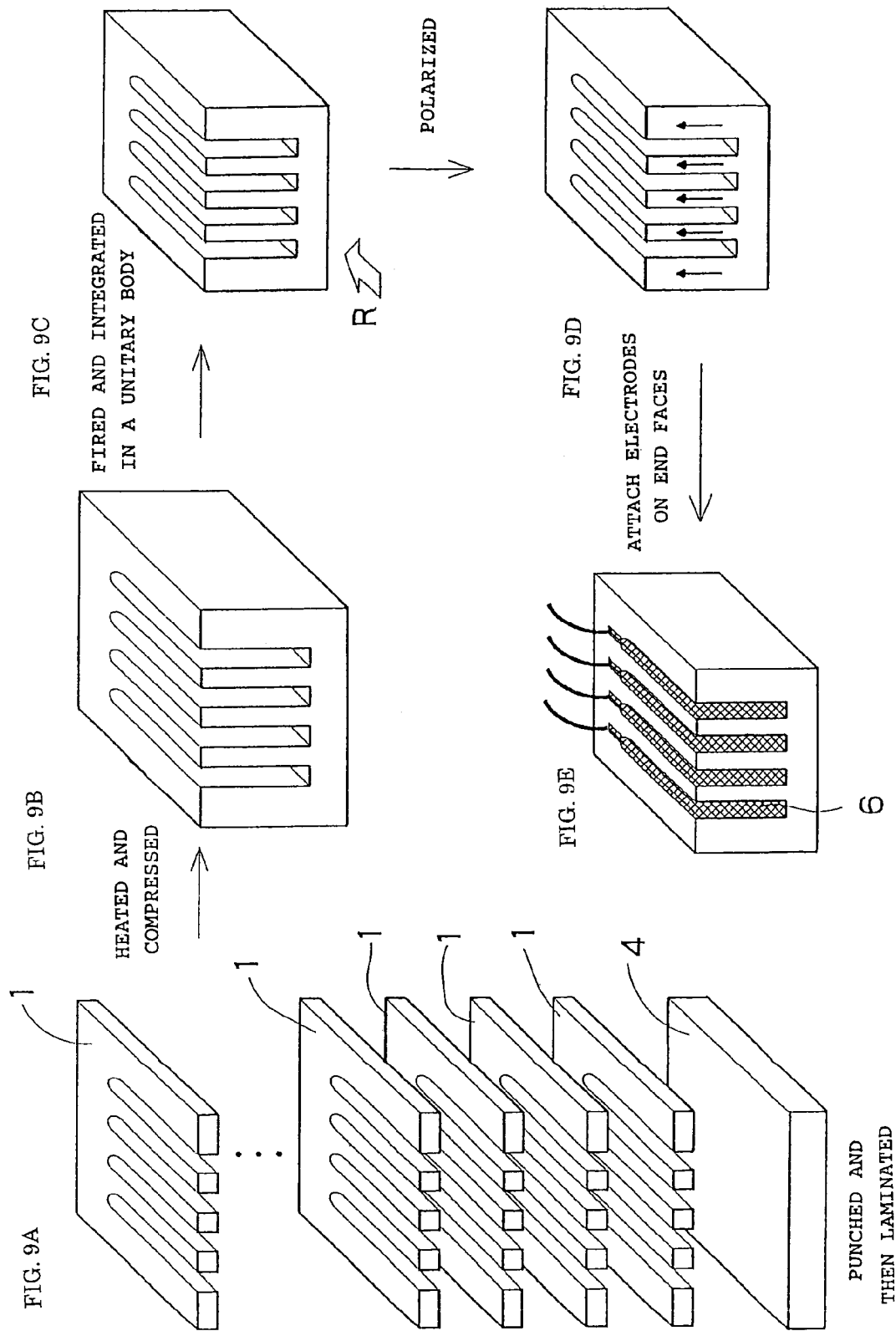

MULTISLIT TYPE ACTUATOR, INKJET HEAD AND METHOD FOR MANUFACTURING MULTISLIT TYPE ACTUATOR

CROSS REFERENCE TO RELATED APPLICATIONS

This application is a continuation of International Application No. PCT/JP02/03422, having an international filing date of Apr. 5, 2002, which designated the United States, and also claims the benefit of Japanese Application No. 2001-108986, filed Apr. 6, 2001, the entireties of which are incorporated herein by reference.

FIELD OF THE INVENTION

The present invention relates to a multislit type actuator formed by aligning and allocating a plurality of actuators made of a piezoelectric material in the shape of comb teeth. Particularly, it relates to a method for manufacturing a multislit type actuator allowing mass production with no need for cleaning to drying processes, allowing the formation of slits having a width of 50 μm or less or having an aspect ratio of 10 or more, allowing the formation of slits hardly generating the destruction of crystal grains in the wall surfaces of the slits formed by the manufacturing method, and allowing mass production of an inkjet head.

BACKGROUND OF THE INVENTION

As an example, there is a shear mode piezoelectric actuator for use in an inkjet head. This has the structure as shown in FIG. 11 in which a plurality of wall parts 22 made of a piezoelectric material formed in a comb teeth shape on a substrate 21, rectangular ink chambers 23 adjacently formed between the wall parts, and the wall parts 22 deformed to vary the volume of the ink chambers for discharge operation.

Such an actuator is formed by the steps shown in FIG. 7. First, a piezoelectric material 17 is prepared in FIG. 7A, and is fired in FIG. 7B. After being fired, the piezoelectric material is polarized in FIG. 7C. Then the fine slits are formed by a dicing saw or the like to form driving portions 18 in a comb teeth shape, and a plurality of slits 19 for storing ink are formed and arranged in FIG. 7D. Then electrodes 20 are formed on the wall surfaces inside the slits in FIG. 7E. After that, as shown in FIG. 11, the ink chambers are closed with a cover plate 24 made of a glass plate or the like, and the opening parts at the tip ends are closed with a nozzle plate 25 formed with nozzles 26.

However, in the manufacturing method described above, the corner parts tend to be chipped because a hard plate made of piezoelectric material is machined, having the following problems.

Firstly, it takes time for slit machining, as such it is unsuitable for mass production.

Secondly, a sufficient cleaning to drying process is needed because the actuator is contaminated with free abrasive grains from machining or working fluids used after slit machining. However, a complex and expensive cleaning process is required for satisfactory cleaning because the parts are weakened by the slit machining.

Thirdly, the width of slits, being used as ink chambers, is limited by the dicer blade to a width of about 70 μm or less. A determination of the width limit must consider the depth of the slits because the wall must be sufficiently thick to withstand the force of the dicer blade making a cut. With this requirement, it is difficult to form at an aspect ratio of 10 or more. On this account, it is impossible to obtain a comb-tooth type actuator of high density, or of high strength and high power output.

Fourthly, only linearly, flat slit machining can be performed because machining is performed by the dicer blade, and components are bonded or the like in downstream process in response to a complex form. As the result of linear machining, piezoelectric stress deformation is generated up to the end of the joined nozzle plate during actuation, causing the durability of the joined surfaces to be reduced.

Fifthly, since the slits are formed by cutting, transgranular fracture is generated in crystal grains located in the side surfaces of the comb teeth, likely causing deterioration in the mechanical properties due to residual compressive stress. FIG. 8 is an explanatory drawing illustrating this. FIG. 8A is an end view as seen from Q shown in FIG. 7, and FIG. 8B is an enlarged sectional view of area N, from FIG. 8A. Piezoelectric crystal grains in the surface of the comb tooth are indicated by slant lines. A part thereof is chipped by cutting with the dicing saw, which generates transgranular fractures, causing deterioration in the mechanical properties. In addition, micro-cracks often occur between the crystal grains or inside the grains by cutting, sometimes causing deterioration in the mechanical properties.

SUMMARY OF THE INVENTION

In order to solve the above problems, inventors first studied a manufacturing method shown in FIG. 9 as a method that does not use a dicer blade. This is a manufacturing method where a predetermined number of piezoelectric material green sheets 1 are separately punched into a comb teeth shape, as shown in FIG. 9A. A jig is used to align and laminate them on a substrate 4 and they are heated and compressed in FIG. 9B. Then they are fired and integrated in a unitary body in FIG. 9C, polarized in FIG. 9D, and then electrodes 6 or the like are formed in FIG. 9E.

However, it was difficult to overlay the punched green sheets 1 without an alignment deviation caused by this manufacturing method. As shown in FIG. 10 illustrating an explanatory drawing of an end face seen from R in FIG. 9, the alignment deviation between the stacked sheets was large enough to generate an alignment deviation of nearly 20 μm in layers, and it was impossible to control the alignment deviation to 10 μm or less. The reasons for the alignment deviation are described below.

Generally, a method for aligning the green sheets includes the following steps. First, holes for positioning are formed in each of the green sheets 1. Then a jig with pins for positioning is prepared, and it penetrates the pins through the holes in the green sheets 1 for lamination. In this method, however, a clearance between the hole and the pin is required to be at least 10 μm. Further, due to the softness of the green sheet 1, an alignment deviation of nearly 20 μm is inevitably generated between the piezoelectric layers when 10 or more layers are laminated.

The generation of such alignment deviation between the piezoelectric layers is not preferable because it causes an electric field concentration in stepped portions, likely causing dielectric breakdown when applying drive voltage to the electrodes. Further, deformations of the comb teeth by a piezoelectric shear vibration mode are uneven so as to generate micro-cracks, likely causing destruction of the element.

In addition, such trouble causes a huge problem, particularly, in a fine multislit type actuator in which a pitch between slits is 200 μm or less. This is because, at this pitch, a width of the piezoelectric layer is 100 μm or less where the slit width is tentatively set at 100 μm, where considerable stress concentrations and electric field concentrations occur as a whole when an alignment deviation as large as 20 μm is generated.

The present invention has been made based on the experimental results. There is provided a multislit type actuator hardly generating the destruction of crystal grains in the wall surfaces of the slits and an inkjet head. Moreover, there is provided a method for manufacturing a multislit type actuator allowing mass production with no need for the cleaning to drying processes in which slits other than a linear form and slits having a width of 50 μm or less or having an aspect ratio of 10 or more can be formed.

First, a multislit type actuator according to the invention is characterized by having a plurality of piezoelectric actuators aligned and allocated in comb teeth formed on a substrate, wherein a condition of crystal grains in side surfaces of the piezoelectric actuators forming wall surfaces of a slit between the comb teeth is that the crystal grains under transgranular fracture are 1% or less. With this configuration, the deterioration in the property due to residual compressive stress is not generated, and durability and reliability can be improved.

With the above configuration, it is preferable that a surface roughness Rt of the wall surfaces of the slit is 10 μm or less and an amount of convexo-concave distortion in the wall surfaces of the slit is 10 μm or less. By configuring the actuator in this manner, since the convexo-concave distortions in the wall surfaces of the slits are small, electric field concentration and stress concentration can be prevented from being generated during drive, and stable operations can be realized.

Further, with the above configuration, a slit width between the comb teeth may be not a simple linear groove but may be varied from a back to a tip end of the comb teeth. Consequently, when the slits are used as the ink path of the inkjet head, it is possible to obtain a comb tooth shape suitable for fluid, which reduces the piezoelectric deforming stress of the tip end parts of the comb teeth. As a result, a long lifetime can be obtained without interposing another component.

Also, it is preferable that with the above configuration, the slit width between each of the comb teeth is not the same and has at least two different widths, and the minimum slit width is less than 70 μm. Consequently, the optimum slit width can be formed in accordance with the purpose, and the actuator having the optimum characteristics can be provided.

One of the inkjet heads, according to the invention, is driven by a shear mode characterized in that a top surface of the actuator opposite to the substrate of the multislit type actuator with the above configuration is closed by a closing plate, and the slit is formed as an ink chamber to allow ink to be discharged in a tip direction of the comb teeth.

Another inkjet head, according to the invention, is driven by a shear mode characterized in that side surfaces of two multislit type actuators with the above mentioned configuration, are joined so as to align with comb tooth parts each other, and slit parts formed in a chamber shape as ink chambers to allow ink to be discharged in a tip direction of the comb teeth. As a result, durability and reliability can be improved, the ink path can be formed in a shape suitable for fluid, and long lifetime can be obtained.

A method for manufacturing a multislit type actuator, according to the invention, is where a plurality of actuators, each comprising a piezoelectric material, are aligned and allocated on a substrate in the shape of comb teeth. The method includes, a first process in which a plurality of piezoelectric material green sheets are prepared, and slit apertures are formed on a first piezoelectric material green sheet among the above plural piezoelectric material green sheets by use of a punch and a die. Secondly, the above first piezoelectric material green sheet is pulled up by use of a stripper. Third, a top portion of the above punch is pulled up to the extent that it is pulled in slightly from the lowest portion of the above pulled up first piezoelectric material green sheet. Fourth, second slit apertures are formed into in a second piezoelectric material green sheet by the above punch. Fifth, the above second piezoelectric material green sheet is pulled up jointly with the above first piezoelectric material green sheet. Sixth, the top portion of the above punch is pulled up to the extent that it is pulled in slightly from the lowest portion of the above pulled up second piezoelectric material green sheet. Seventh, hereafter a plurality of the piezoelectric material green sheets are laminated by repeating from the fourth process to the sixth process to form a plurality of piezoelectric layers of comb teeth shape. Eighth, the piezoelectric layers are fired so that one side surface of the piezoelectric layers is brought into close contact with a substrate.

By manufacturing the multislit type actuator in this manner, the punch itself is used as a laminating axis of the piezoelectric material green sheets, and without moving the punched-out piezoelectric material green sheet, the comb teeth are formed by stacking them in order. Therefore, no transformation of slit apertures occurs, and laminating is carried out with high precision so that a side surface of the comb teeth with little convexo-concave can be formed. Therefore, it is possible to make an actuator with excellent characteristics, even in the case of comb teeth with a slit width of less than 70 μm, or a depth of the slits with an aspect ratio of 10 or more.

Also, by design of a punch, a slit width may be varied from a back to a tip end of the comb teeth. Moreover, the slit width shrinks at the time of firing by almost the same amount as the punching width of the punch at the time of punching the sheet. Therefore, it is possible to finally form refined slits with width of 30–50 μm.

Moreover, since the slits are formed before they are fired, the wall surfaces of the slits remain as the surfaces fired at high temperature. Further, since they are not subject to transgranular fracture, residual compressive stress is not generated, and the excellent properties can be maintained. Further, as the cutting process is unnecessary to form the slits, cleaning and drying processes are not needed and the process is simplified.

BRIEF DESCRIPTION OF THE DRAWINGS

FIGS. 1A–1E are explanatory drawings illustrating a multislit type actuator and a method for manufacturing the same according to the invention.

FIG. 2A is a diagram depicting that a first piezoelectric material green sheet is placed on a die. FIG. 2B is a process drawing of punching the first piezoelectric material green sheet. FIG. 2C is a diagram depicting that a second piezoelectric material green sheet is placed. FIG. 2D is a process drawing of punching the second piezoelectric material green sheet. FIG. 2E is a process drawing depicting that the laminated piezoelectric material green sheets are separated by a stripper after the entire sheets are punched and lamination is finished.

FIG. 3A is a whole view, and FIG. 3B is an enlarged schematic cross section of M part.

FIGS. 4A–4E are explanatory drawings illustrating another method for manufacturing the multislit type actuator according to the invention.

FIG. 5A is a cross section depicting an actuator that slits having two kinds of width are disposed alternately. FIG. 5B is a perspective view depicting an actuator that the slit width is varied toward the tip ends of comb teeth.

FIGS. 6A and 6B are cross sections depicting other forms of the multislit type actuator according to the invention, which is adapted to a transfer apparatus. FIG. 6A is the case where slits are formed at a fixed width, and FIG. 6B is the case where the slit width is varied.

FIGS. 7A–7E are explanatory drawings illustrating a method for manufacturing the traditional multislit type actuator.

FIG. 8A is an end view seen from Q, and FIG. 8B is an enlarged schematic cross section of N part.

FIGS. 9A–9E are explanatory drawings illustrating another traditional manufacture method.

DETAILED DESCRIPTION OF THE INVENTION

Figure 2A:
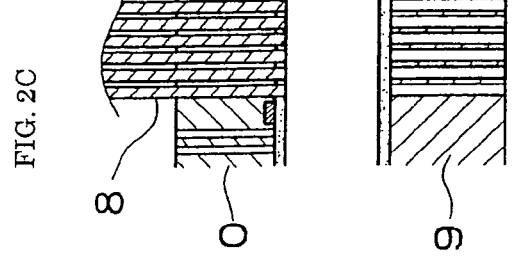
FIGS. 2A–2E are explanatory drawings illustrating a method of forming slits and laminating piezoelectric material green sheets simultaneously shown in FIGS. 1A–1E.

Hereafter, more specific embodiments of the invention will be described in detail based on the drawings. FIG. 1 depicts one example of a multislit type actuator according to the invention. FIG. 1A to FIG. 1D depict the outline of manufacturing processes and FIG. 1E depicts the outline of the completed actuator.

The manufacturing processes will be described below. First, piezoelectric material green sheets 1 (hereinafter, simply called sheets) are formed with slits 2 and laminated simultaneously by a method described later. The sheets 1 are laminated to form comb teeth 3, and the lamination is completed at the same time when punching is finished in FIG. 1A. Subsequently, the laminated sheets 1, 1 . . . are placed on a substrate 4 made of a sheet separately prepared, so that the comb teeth 3 are formed thereon at the same time in FIG. 1B. They are heated and compressed to closely contact each layer in FIG. 1C, and the entire sheets 1, 1 . . . and the substrate 4 are integrated in a unitary body by firing to complete drive portions in FIG. 1D. After that, electrodes 6 are formed on the wall surfaces and the like inside the slits to obtain a complete multislit type actuator in FIG. 1E. In addition, the sheets described above are formed by a well-known tape forming technique such as a doctor blade method and the like.

In this manner, since the comb teeth are formed before firing, the wall surfaces of the slits are maintained as the fired surfaces. Therefore, the transgranular fracture of piezoelectric crystals which is generated when slits are machined with a dicer and the like does not occur. As a result, deterioration in the property due to residual compressive stress is not generated, and durability and reliability can be improved. Furthermore, damage (chipping) is hardly caused in the corner portions during machining, and the cleaning to drying processes are unnecessary because there is no machining with the dicer.

FIG. 2 shows a concrete manufacturing method for carrying out the formation and lamination of the comb teeth 3 at the same moment. In this method, a metal mold is used which comprises a punch 8 around which a stripper 10 for operating sheet laminating is disposed, and a die 9. FIG. 2A shows a before punching-out state in which a first sheet 1a is mounted on the die, and in FIG. 2B, the punch 8 and the stripper 10 are lowered and the sheet 1a is punched out through slit apertures to form comb teeth (first process).

Then, in preparation for punching-out of a second sheet 1b, the first sheet 1a is moved upward while remaining in contact with the stripper 10 and separating from the die 9 (second process). The first sheet 1a may be held in contact with the stripper 10 using a suction aperture formed in the stripper 10 to perform vacuum suction.

Also, in preparation for punching-out of the second sheet 1b, the punch 8 and the stripper 10 are pulled up from the die 9. At mid-flow of the pulling-up, it is preferable that a top portion of the punch 8 is not returned to inside of the slit aperture of the first sheet 1a which was pulled up jointly. When the pulling-up is stopped, it is important that the top portion of the punch is stopped at a position where it is pulled in slightly from the lowest portion of the sheet 1a which was pulled up jointly (third process). If the punch 8 is returned to inside of the aperture of the first sheet 1a, or is housed completely in the stripper 10, the formed apertures are deformed since the sheet 1 is soft. Thus, flatness of a side surface is deteriorated when the sheets are laminated to form the comb teeth.

Figure 2B:
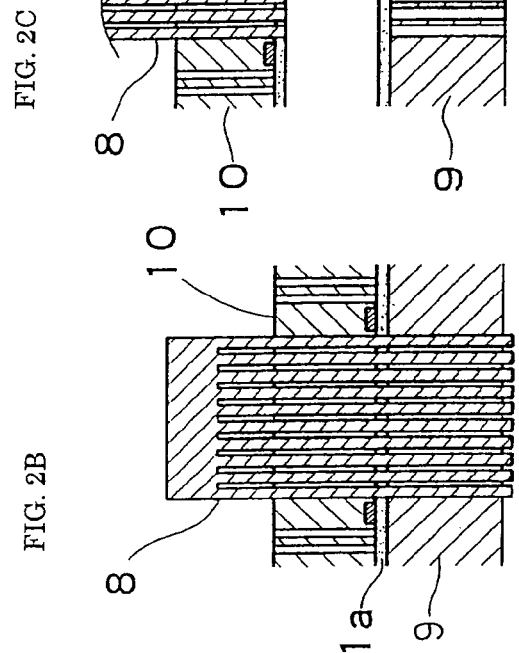
Figure 2C:
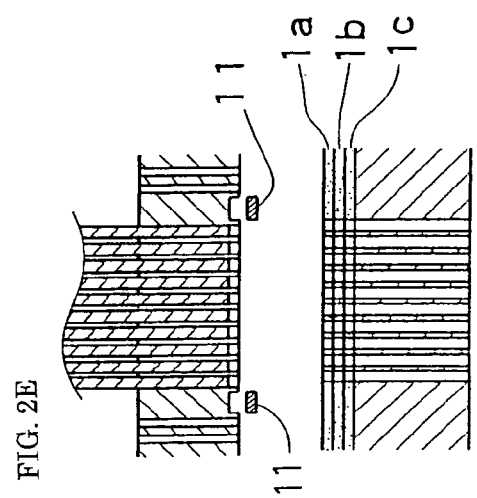
Figure 2D:
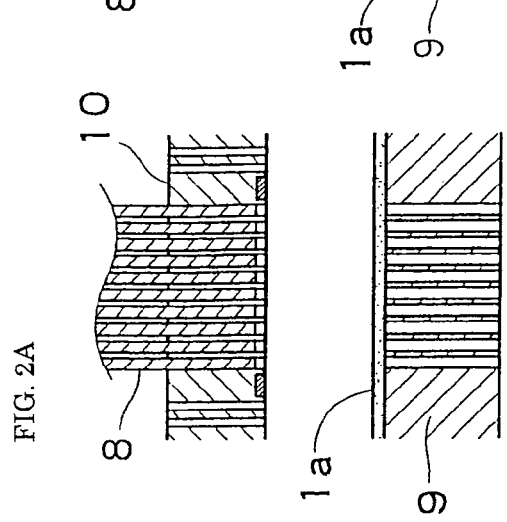

FIG. 2D shows a process for punching out the second sheet 1b, and by closely contacting the first sheet 1a to the stripper 10, the second sheet 1b can be mounted easily on the die 9 and then punched out as shown in FIG. 2B. Further, the second sheet 1b can be overlapped on the first sheet 1a simultaneously (fourth process).

Then, the first sheet 1a and the second sheet 1b, which are punched out by repeating processes of FIG. 2C and FIG. 2D, are overlapped and pulled up by the stripper 10 (fifth process), and punching-out of a third sheet 1c is prepared. However, at this time, it is also important to stop at a position where it is pulled in slightly from the lowest portion of the sheet 1 which is pulled up jointly (sixth process).

Thereafter, by repeating the fourth to sixth processes, punching-out and laminating of sheets as required are repeated (seventh process).

Figure 2E:
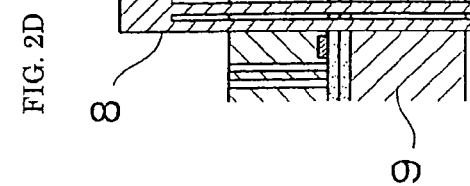

FIG. 2E shows a state where punching-out is completed. When punching-out and laminating of sheets 1 as required are completed, holding of the sheet by the stripper 10 is released, and it becomes possible that the sheet 1, which was punched out and laminated, is separated from the stripper 10, as shown in the figure. The separation can be ensured by disposing a separation jig 11 on an under surface of the stripper.

The operation described above is one to which a manufacturing method described in Japanese Patent Application No. 2000-280573 is applied. By using this method, a multislit type laminated body having comb teeth with desirable thickness can be obtained. Thereafter, the laminated body is disposed on the substrate 4 made of a piezoelectric material green sheet in the same manner. Then a compressing and laminating process is performed to form a laminated body which is capable of being handled, and then, on the condition which is suitable to characteristics of the sheet, the laminated body is fired and integrated (eighth process).

Figure 3A:
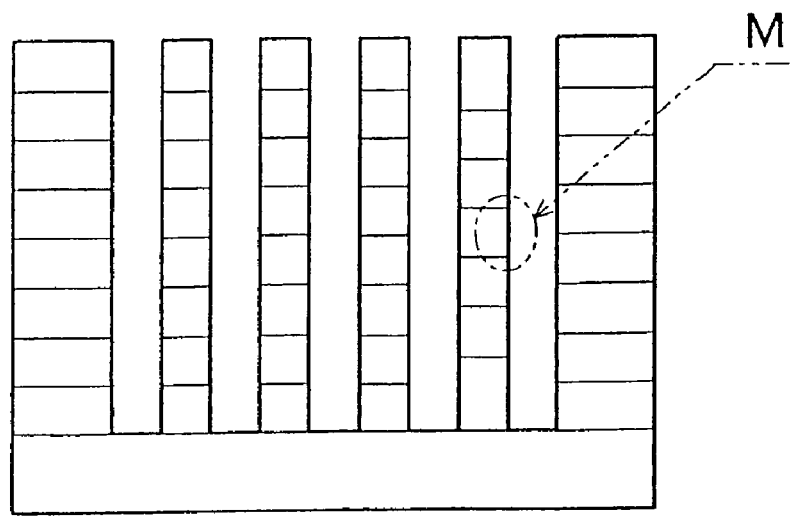
FIGS. 3A and 3B are end views seen from P shown in FIG. 1D.
Figure 3B:
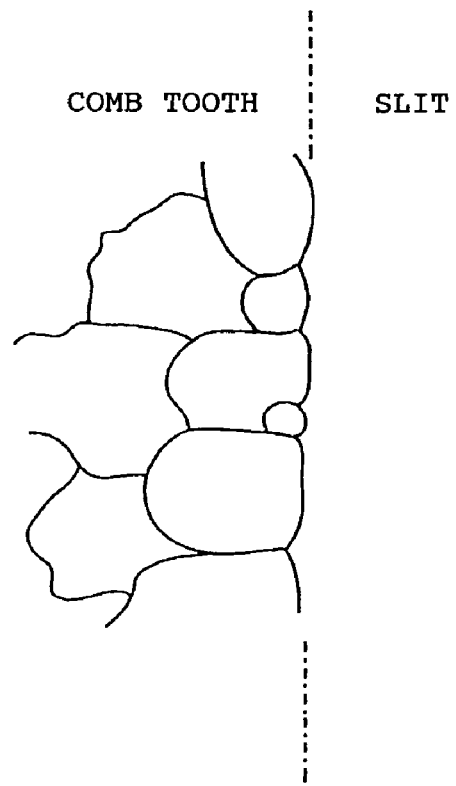

FIG. 3A depicts an end view seen from P shown in FIG. 1D, and FIG. 3B depicts an enlarged schematic cross section of area M in the wall surface of the slit. The experimental results of alignment precision of stacking accuracy according to the manufacturing method described above will be shown. For example, when comb teeth, having a slit of 70 µm and a width of 100 µm, are formed in a sheet having a thickness of 40 µm, a Young's modulus of 39 N/mm$^2$, and ten layers of the sheets are laminated, an amount of an alignment deviation between the layers after firing is 4 µm at the maximum, and a surface roughness Rt is 7 µm. As shown in the drawing, the side surfaces of the comb teeth are smoothened without convexo-concave distortion. Since the wall surfaces of the slits are fired surfaces, transgranular fracture is not present in the piezoelectric crystal grains, even in crystal grains in the surface, and the crystal grains under transgranular fracture can be suppressed at 1% or less as shown in FIG. 3B. Additionally, the slit width after firing was about 55 µm resulting from firing shrinkage.

In this manner, the punch and the die are used to perform the formation of the slits and lamination simultaneously, and the punch itself is also used as the positioning axis for laminating the piezoelectric material green sheets, thereby preventing the slit apertures formed by the punch from being deformed. Therefore, the deformation of the slit apertures is not made and an amount of an alignment deviation between the layers can be suppressed to less than 5 µm. Further, the lamination having a high precision can be performed, and the wall surfaces of the slits with little convexo-concave distortion can be formed. On this account, even the comb teeth having a slit width of less than 70 µm and a slit depth of an aspect ratio of 10 or greater can be formed easily, and an actuator having excellent properties can be obtained.

Furthermore, the deterioration in the property due to residual compressive stress is not generated because the crystal grains in the wall surfaces of the slit between the comb teeth are not destroyed. Moreover, a jig for transferring the sheets or space for lamination is unnecessary according to the manufacturing method described above, and then manufacturing lines can be simplified as well, and low cost manufacture is feasible.

Moreover, the slit width shrinks at the time of firing which is almost the same as the punching width of the punch at the time of punching the sheet. Utilizing this and the manufacturing method described above, the combination of machining thin slits and firing shrinkage can form micro-slits having a width of 30 to 50 µm. Further, slits, other than linear ones, can be formed easily depending on the design of the punch, allowing the optimum shapes to be formed according to use.

FIG. 4 depicts another manufacturing method according to the invention. First, each of sheets 1 is formed with slit-shaped apertures 2a and laminated simultaneously applying the method described above in FIG. 4A. When punching and laminating the sheets are finished, the laminated product is similarly stacked on a substrate 4 made of a piezoelectric material green sheet in FIG. 4B. Then they are heated and compressed to closely contact each layer in FIG. 4C, and fired and integrated in a unitary body in FIG. 4D. The manufacturing method from FIG. 4A to FIG. 4D is the same as the manufacturing method shown in FIG. 2. However, in this case, the slit apertures 2a, formed by punching, are long apertures with both ends closed respectively, and one end is cut in FIG. 4E after being fired for forming the multislit shaped in comb teeth. Thereafter, electrodes and the like are formed for completion.

In this manner, the comb teeth are not formed by punching directly, and both ends of the comb teeth are joined for lamination. Thus, the alignment precision of stacking of the comb tooth parts of each sheet can be more improved. It should be noted that the cleaning to drying process for the cut parts is required to be increased, since the end parts need to be cut after firing.

Figure 5A:
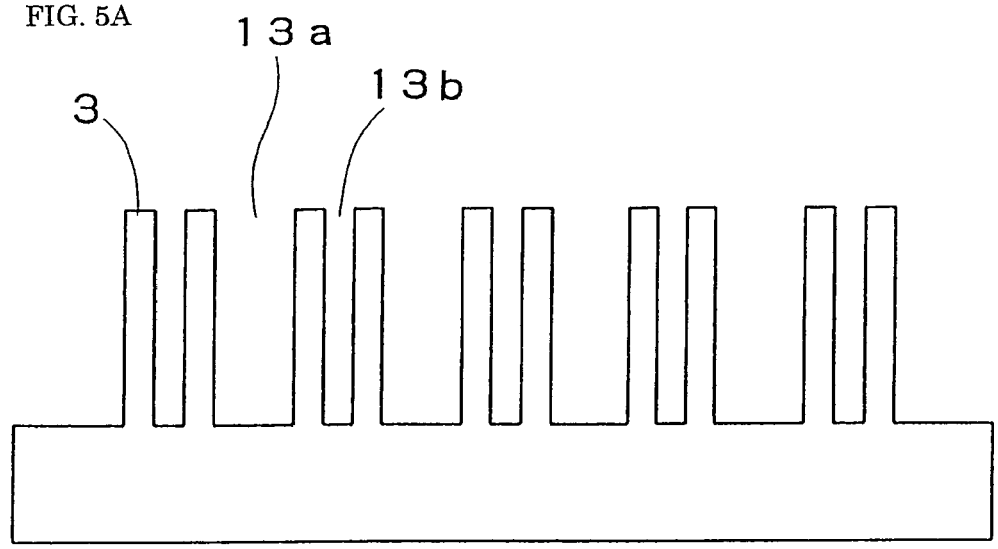
FIGS. 5A and 5B depict forms that the multislit type actuator according to the invention is adapted to an inkjet head.
Figure 5B:
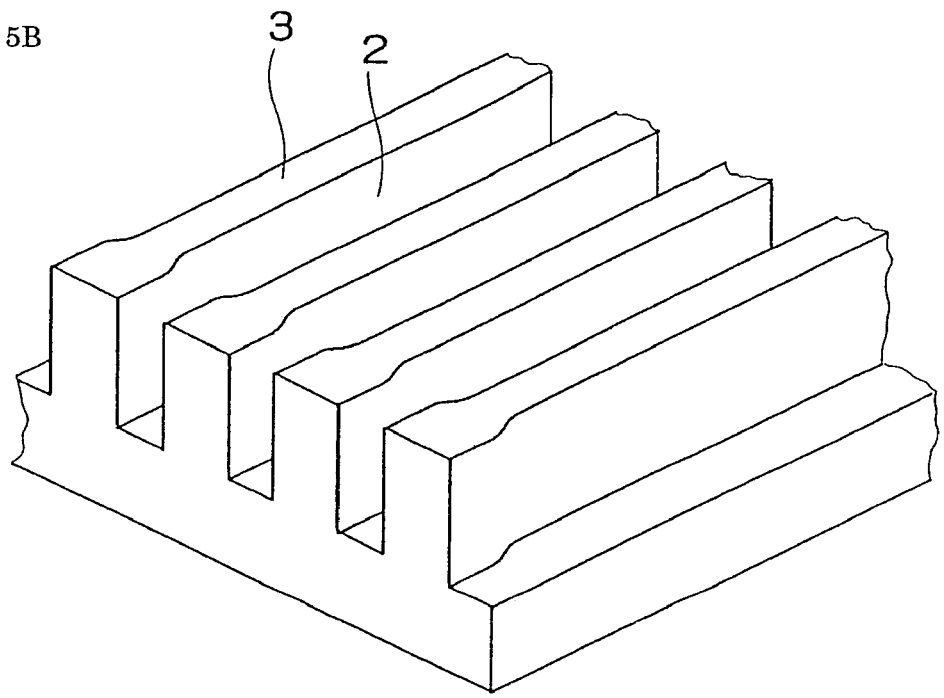
Figure 8A:
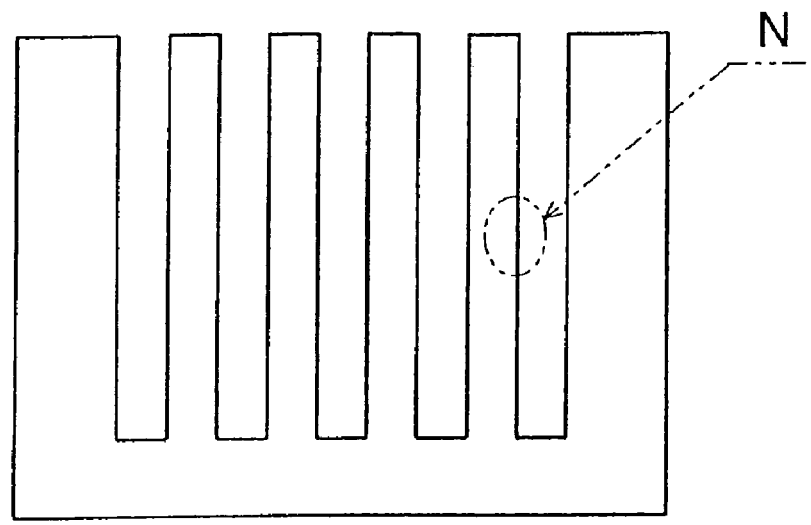
FIGS. 8A and 8B are a multislit type actuator manufactured according to the method shown in FIGS. 7A–7E.
Figure 8B:
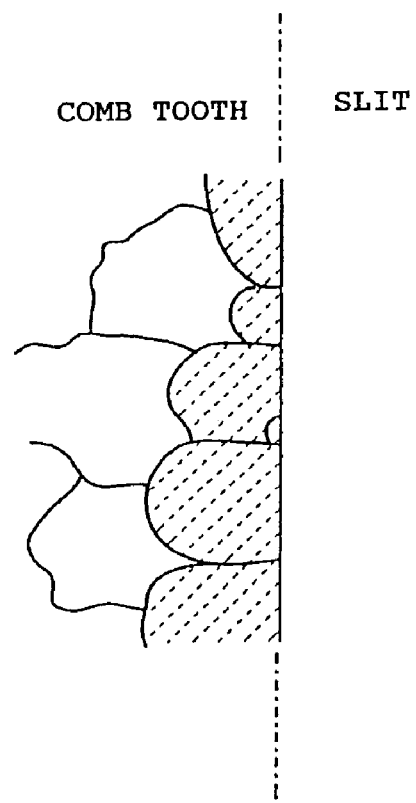
Figure 10:
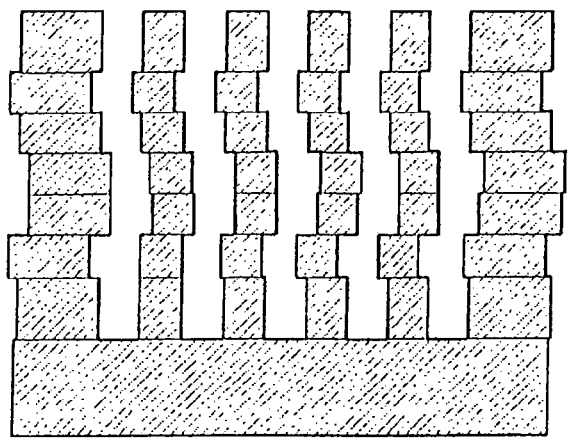
FIG. 10 is an end view seen from R shown in FIG. 9C.

FIGS. 5A–5B are cross sectional explanatory drawings of an actuator part that is the essential part of a shear mode type head, depicting the case where the multislit type actuator, according to the invention, is adapted to an inkjet head. In FIG. 5A, slits 13a and 13b having two kinds of width are alternately formed, and the slits 13a of wide width are disposed as ink chambers and the slits 13b of narrow width are disposed as slits for separation of adjacent ink chambers.

In this manner, the manufacturing method described above can easily form adjacent slits having various kinds of width. Accordingly, when the all ink chambers are separated by the slits 13b, they can be driven independently, and the shear mode type head of high performance can be obtained.

Figure 11:
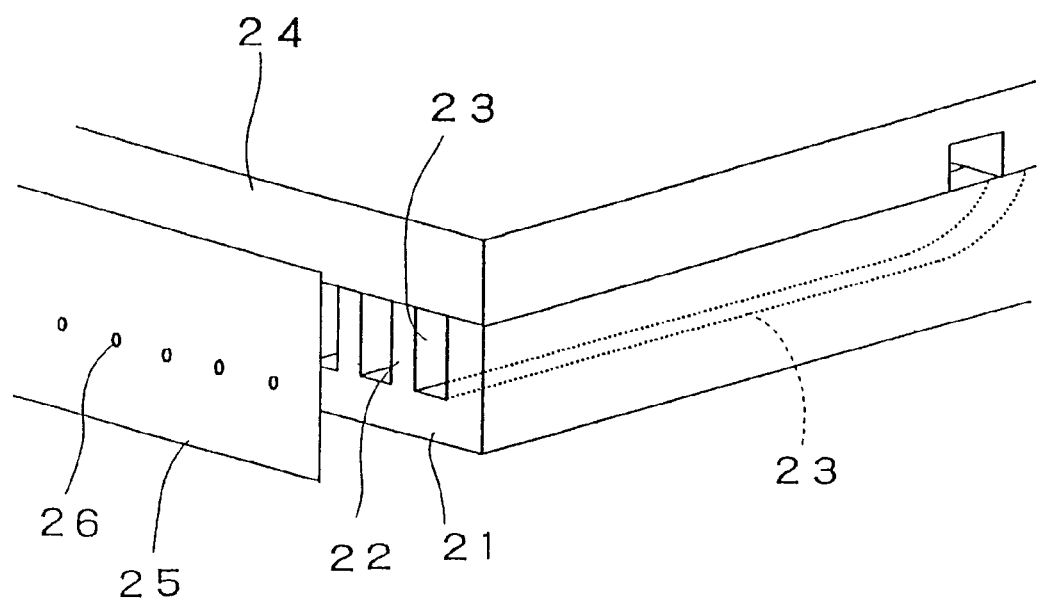
FIG. 11 is an explanatory drawing illustrating a Xaar type inkjet head.

Additionally, in FIG. 5B, the tip end portions of the comb teeth are formed wide in width, and slits are formed narrow in reverse. In this manner, only changing the shape of a punch and a die can vary a slit width of one slit in the longitudinal direction easily as well, so that a shape of an ink path suitable for fluid and the shape intending the reduction in stress in the joined surface to the nozzle plate can be easily realized. Further, by forming the tip end portions of the comb teeth widely, the piezoelectric deforming stress occurred at the joined portion which is the portion of the nozzle plate (shown in FIG. 11) to be bonded to the tip end surfaces of the comb teeth can be reduced.

Accordingly, the optimum slit width can be formed in accordance with the purpose to provide an actuator having the optimum property. Further, a shape suitable for fluid can be formed when the slits are used as the ink path for an inkjet head. Moreover, the piezoelectric deforming stress of the tip end portions of the comb teeth can be reduced, and long lifetime can be obtained without interposing another component.

On the other hand, it is inconvenient that when various kinds of slits are desired to form by machining with the dicer, a dicer blade having the edge thickness according to the kind needs to be prepared for use. Further, when a width of the comb tooth is varied in the base portion and the tip end portion, another component is required to form a desired slit.

FIG. 6 depicts the case where the multislit type actuator according to the invention is adapted to a transfer apparatus. FIG. 6A depicts that slits are formed at a fixed interval to allow transfer at a constant speed, and FIG. 6B depicts that the intervals between slits are varied to change the transfer speed. 14 denotes a carrier part, and voltage is applied to each of the comb teeth 3 to deform them in the arrow direction, thereby allowing the placed part to be transferred as shown in FIG. 6A.

In the manufacturing processes of microfabricated products, particularly in the micromachine factory, the transfer method is a problem. When the transfer apparatus is formed by the multislit type actuator in this manner, a micromachine can be transferred smoothly.

Moreover, the multislit type actuator according to the invention can be also utilized as a micro relay or microswitch, greatly contributing to the development of the industry.

The invention claimed is:

1. A multislit type actuator comprising a plurality of piezoelectric actuators aligned and allocated in comb teeth formed on a substrate, wherein a condition of crystal grains in side surfaces of the piezoelectric actuators forming wall surfaces of a slit between the comb teeth is that the crystal grains under transgranular fracture are 1% or below.

2. The multislit type actuator according to claim 1, wherein an amount of convexo-concave distortion in the wall surfaces of the slit is 10 μm or less.

3. The multislit type actuator according to claim 2, wherein a slit width between the comb teeth is varied from a back to a tip end of the comb teeth.

4. The multislit type actuator according to claim 2 having slits of at least two kinds of width, wherein the slit width between each of the comb teeth is not the same.

5. The multislit type actuator according to claim 2, wherein a minimum slit width is less than 70 μm.

6. An inkjet head driven by a shear mode, wherein a top of the actuator opposing to the substrate of the multislit type actuator according to claim 2 is closed by a closing plate, and the slit is formed as an ink chamber to allow ink to be discharged in a direction of the tip of comb teeth.

7. An inkjet head driven by a shear mode, wherein side surfaces of two multislit type actuators according to claim 2 are joined so as to align with comb tooth parts each other, and slit portions formed in a chamber shape as ink chambers to allow ink to be discharged in a tip direction of the comb teeth.

8. The multislit type actuator according to claim 1, wherein a surface roughness Rt of the wall surfaces of the slit is 10 μm or less.

9. The multislit type actuator according to claim 8, wherein a slit width between the comb teeth is varied from a back to a tip end of the comb teeth.

10. The multislit type actuator according to claim 8 having slits of at least two kinds of width, wherein the slit width between each of the comb teeth is not the same.

11. The multislit type actuator according to claim 8, wherein a minimum slit width is less than 70 μm.

12. The multislit type actuator according to claim 1, wherein a slit width between the comb teeth is varied from a back to a tip end of the comb teeth.

13. The multislit type actuator according to claim 12 having slits of at least two kinds of width, wherein the slit width between each of the comb teeth is not the same.

14. The multislit type actuator according to claim 12, wherein a minimum slit width is less than 70 μm.

15. The multislit type actuator according to claim 1 having slits of at least two kinds of width, wherein the slit width between each of the comb teeth is not the same.

16. The multislit type actuator according to claim 15, wherein a minimum slit width is less than 70 μm.

17. The multislit type actuator according to claim 1, wherein a minimum slit width is less than 70 μm.

18. An inkjet head driven by a shear mode, wherein a top of the actuator opposing to the substrate of the multislit type actuator according to claim 1 is closed by a closing plate, and the slit is formed as an ink chamber to allow ink to be discharged in a direction of the tip of comb teeth.

19. An inkjet head driven by a shear mode, wherein side surfaces of two multislit type actuators according to claim 1 are joined so as to align with comb tooth parts each other, and slit portions formed in a chamber shape as ink chambers to allow ink to be discharged in a tip direction of the comb teeth.

* * * * *